(12) United States Patent
Kinzer

(10) Patent No.: US 10,461,161 B1
(45) Date of Patent: Oct. 29, 2019

(54) GAN DEVICE WITH FLOATING FIELD PLATES

(71) Applicant: Navitas Semiconductor, Inc., El Segundo, CA (US)

(72) Inventor: Daniel Marvin Kinzer, El Segundo, CA (US)

(73) Assignee: NAVITAS SEMICONDUCTOR, INC., El Segundo, CA (US)

( * ) Notice: Subject to any disclaimer, the term of this patent is extended or adjusted under 35 U.S.C. 154(b) by 0 days.

(21) Appl. No.: 15/878,309

(22) Filed: Jan. 23, 2018

Related U.S. Application Data

(60) Provisional application No. 62/449,216, filed on Jan. 23, 2017.

(51) Int. Cl.
*H01L 29/40* (2006.01)
*H01L 29/778* (2006.01)
*H01L 29/20* (2006.01)

(52) U.S. Cl.
CPC ........ *H01L 29/404* (2013.01); *H01L 29/2003* (2013.01); *H01L 29/7787* (2013.01)

(58) Field of Classification Search
None
See application file for complete search history.

(56) References Cited

U.S. PATENT DOCUMENTS

| | | | | |
|---|---|---|---|---|
| 8,866,191 B2* | 10/2014 | Bahat-Treidel | ....... | H01L 29/404 257/192 |
| 2007/0235775 A1* | 10/2007 | Wu | ...................... | H01L 29/7787 257/288 |
| 2012/0037985 A1* | 2/2012 | Smith | ................... | H01L 29/402 257/336 |
| 2015/0187599 A1* | 7/2015 | Ko | ...................... | H01L 21/3212 438/492 |
| 2015/0357422 A1* | 12/2015 | Liao | ...................... | H01L 29/402 257/76 |
| 2016/0190297 A1* | 6/2016 | Kudymov | ............. | H01L 29/404 257/76 |
| 2017/0104076 A1* | 4/2017 | Prechtl | ................ | H01L 29/2003 |

* cited by examiner

*Primary Examiner* — Whitney Moore
(74) *Attorney, Agent, or Firm* — Kilpatrick Townsend & Stockton LLP

(57) ABSTRACT

A lateral transistor includes a source a gate and a drain connection to a transition layer within a semiconductor substrate. One or more capacitively coupled floating field plates are connected to the source connection such that the source voltage is uniformly distributed across the field plates.

20 Claims, 4 Drawing Sheets

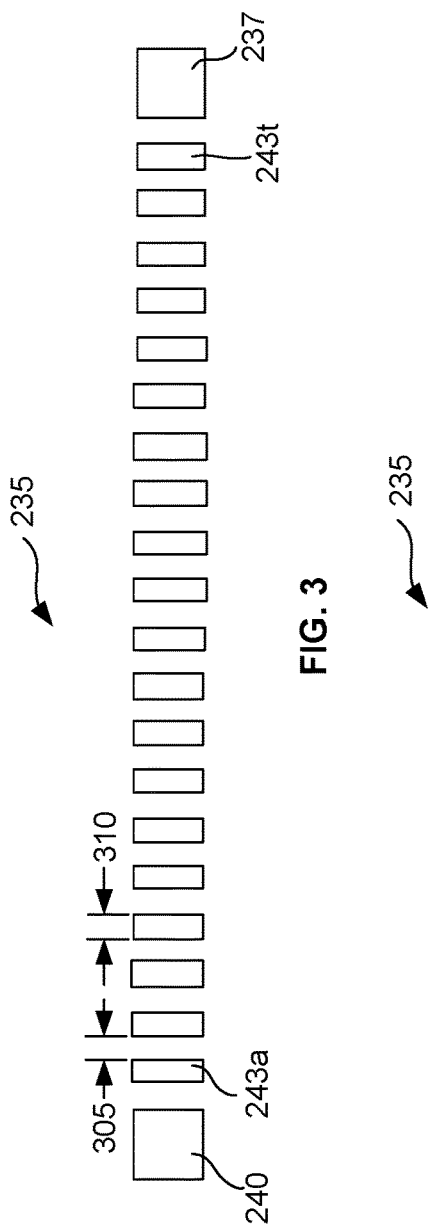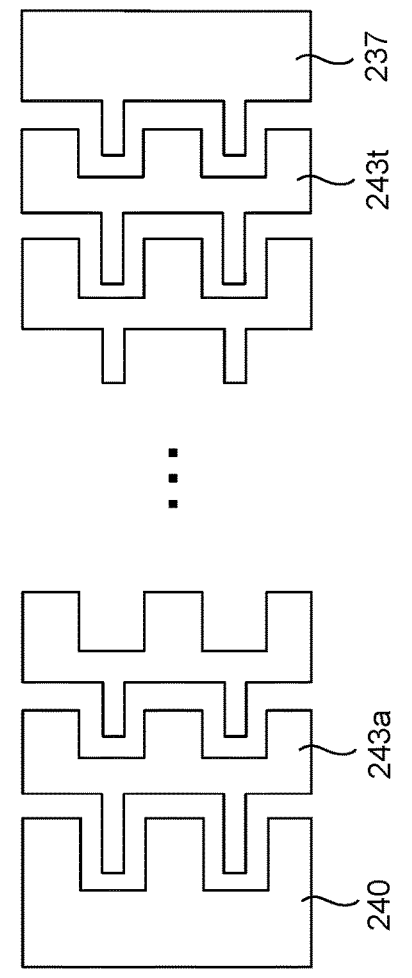

GAN DEVICE WITH FLOATING FIELD PLATES

CROSS-REFERENCES TO OTHER APPLICATIONS

This application claims priority to U.S. provisional patent application Ser. No. 62/449,216, for "GAN DEVICE WITH HIGH-VOLTAGE TERMINATION AND FLOATING FIELD RINGS" filed on Jan. 23, 2017 which is hereby incorporated by reference in entirety for all purposes.

FIELD

The described embodiments relate generally to semiconductor devices that employ field termination structures, and more particularly to high-voltage lateral semiconductor devices having top surface electrodes for positive and negative connections and one or more floating field plates within the field termination structure.

BACKGROUND

High voltage semiconductor devices sometimes employ field termination structures to block high voltage in a stable and reliable manner. Field termination structures can traditionally be formed from a continuous field plate that is directly coupled to a source terminal of the semiconductor device. During application of a voltage potential between the source and the drain of the semiconductor device the electric potential applied to the source creates an electric field across the field plate to change a state of semiconductor material adjacent the field plate. In some devices the application of an electric field across the field plate blocks the flow of current through the semiconducting material. Because the field plate is a continuous conductor, the electric field may not be uniform across the field plate and may peak at an end of the plate nearest the drain, causing undesirable effects within the semiconductor device. In particular, in some applications the electric field generated by the field plate can be large enough to form hot carriers that are injected into semiconducting or insulating layers that are adjacent the field plate. These hot carriers can then be trapped, and can alter and/or degrade the characteristics of the semiconductor device.

One consequence of these trapped charges can be a reduction in a density of electrons in the two-dimensional electron gas (2DEG) region in the transistor. This reduction may cause a higher on-state resistance that may result in a higher voltage drop during current conduction and higher energy losses. This reduction can be temporary, decaying away in microseconds, or can be longer lasting, such as minutes, hours, or even days. In addition, long-term exposure to high electric fields can increase the leakage of the semiconductor device or even result in physical damage, overheating, or catastrophic failure of the voltage blocking structure and ultimately the entire semiconductor device.

New semiconductor devices can require new features or new methods of forming field termination structures so the electric field is more uniformly distributed across the field termination structure and maintained below the breakdown field of the semiconductor materials while minimizing the space required to support the field such that the reliability, performance and cost of the semiconductor device is optimized.

SUMMARY

Some embodiments of the present disclosure relate to semiconductor devices including field termination structures that include one or more floating field plates. Some embodiments relate to gallium nitride based devices that control the voltage blocking capability of the transistor with a plurality of floating field plates that uniformly distribute a source voltage across an active transistor region.

In some embodiments a semiconductor device comprises a substrate including a transition layer that can form a two-dimensional electron gas, a source electrode ohmically coupled to the transition layer, a drain electrode ohmically coupled to the transition layer, a gate stack formed on the transition layer and a field termination structure spaced apart from the transition layer and positioned between the gate stack and the drain electrode. The field termination structure includes a source plate electrically connected to the source electrode and at least one capacitively coupled floating plate.

In various embodiments the field termination structure is disposed within a single layer and there are a plurality of floating plates capacitively coupled by adjacent edges to one another. In some embodiments the field termination structure is formed on a metal layer that includes a drain plate coupled to the drain electrode, a source plate coupled to the source electrode and the at least one floating plate. In various embodiments the at least one floating plate includes a plurality of isolated floating plates that are uniformly spaced apart from one another and are positioned between the drain plate and the source plate.

In some embodiments a voltage potential applied between the source electrode and the drain electrode is evenly distributed across the plurality of separate floating plates. In various embodiments the field termination structure includes a first field plate formed on a first metal layer and a second field plate formed on a second metal layer that is spaced apart from the first metal layer. In some embodiments the first field plate includes a plurality of separate floating plates that are uniformly spaced apart from one another and the second field plate includes a plurality of separate floating upper metal plates that are uniformly spaced apart from one another. In various embodiments the plurality of separate floating plates are laterally positioned such that each of the plurality of separate floating upper metal plates overlaps at least two floating plates. In some embodiments the substrate comprises gallium nitride.

In some embodiments a transistor comprises a substrate comprising a semiconductor material, a source electrode coupled to the substrate, a drain electrode coupled to the substrate, a gate stack formed on the substrate and a field termination structure positioned between the gate stack and the drain electrode. The field termination structure includes a source plate electrically connected to the source electrode and at least one isolated plate.

In some embodiments the substrate comprises a transition layer capable of forming a two-dimensional electron gas. In various embodiments the field termination structure is formed within a single layer and there are a plurality of isolated plates capacitively coupled by adjacent edges to one another. In some embodiments the field termination structure is formed on a gate metal layer that includes a drain plate coupled to the drain electrode, a source plate coupled to the source electrode and the at least one isolated plate positioned between the drain plate and the source plate.

In some embodiments the at least one isolated plate includes a plurality of separate isolated plates that are uniformly spaced apart from one another and are positioned between the drain plate and the source plate. In various embodiments the field termination structure includes a first field plate formed on a gate metal layer and a second field plate formed on an upper metal layer that is spaced apart from the gate metal layer.

In some embodiments the first field plate includes a plurality of separate floating plates that are uniformly spaced apart from one another and the second field plate includes a plurality of isolated upper metal plates that are uniformly spaced apart from one another. In various embodiments the plurality of isolated floating plates are laterally positioned such that each of the plurality of separate floating upper metal plates overlaps at least two floating plates.

In some embodiments a semiconductor device comprises a substrate including a semiconducting layer, an ohmic metal layer formed on the substrate and including a source portion and a drain portion, a gate stack formed on the substrate, a metal layer formed above and separated from the ohmic metal layer and including a source plate, a drain plate and a plurality of electrically isolated plates and a top metal layer formed above and separated from the metal layer and including a gate terminal, a source terminal and a drain terminal. The gate terminal is electrically connected to the gate stack, the source terminal is electrically connected to the source plate, and the drain terminal is electrically connected to the drain plate.

In some embodiments the plurality of electrically isolated plates are capacitively coupled by adjacent edges to one another. In various embodiments the plurality of electrically isolated plates are positioned between the source plate and the drain plate.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

BRIEF DESCRIPTION OF THE DRAWINGS

FIG. 3 is a top plan view of the field plates illustrated in FIG. 2;

FIG. 4 is a top plan view of an alternative field plate layout according to embodiments of the disclosure.

DETAILED DESCRIPTION

Figure 1:
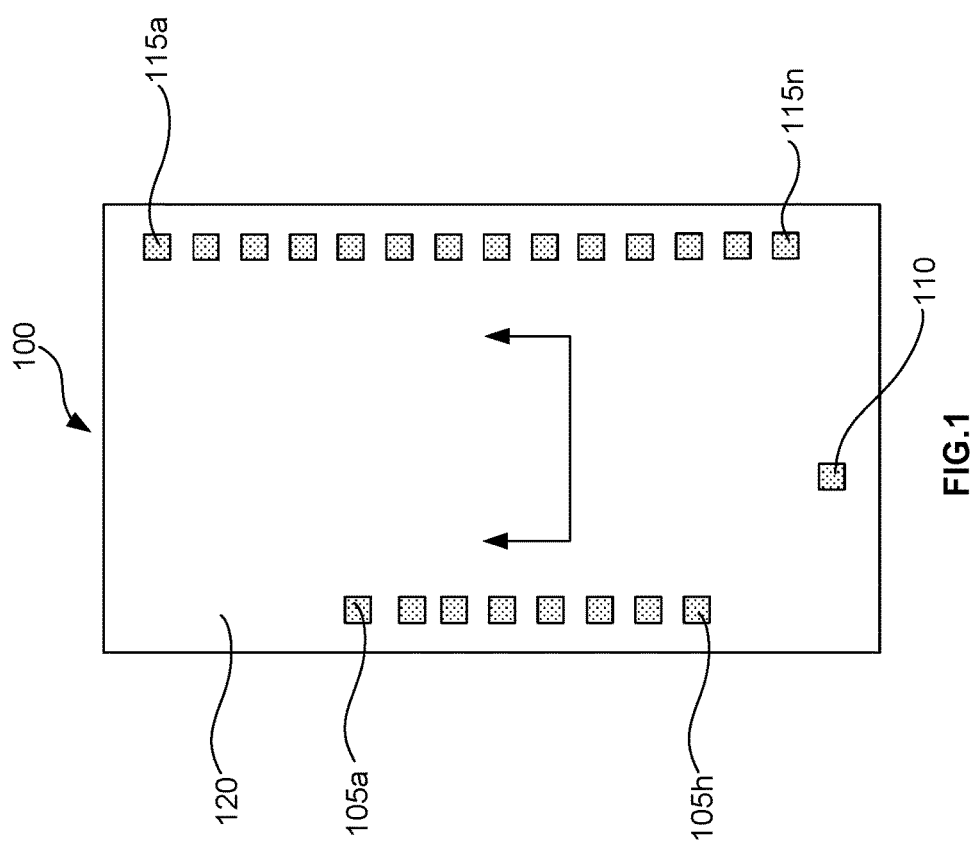
FIG. 1 is a top plan view of an example semiconductor die according to an embodiment of the disclosure.

FIG. 1 is a top plan view of an example semiconductor die 100 according to an embodiment of the disclosure. As shown in FIG. 1, in this embodiment semiconductor die 100 is a lateral semiconductor device that includes source terminals 105a . . . 105h, a gate terminal 110 and drain terminals 115a . . . 115n all disposed on a top surface 120 of the die. In some embodiments, semiconductor die 100 can be formed on a gallium nitride (GaN) based substrate, however in other embodiments the substrate can be silicon-based or can be any other type of semiconductor material or combination of materials. Further, the embodiments disclosed herein are in no way limited to only lateral devices and can be applied in other structures and/or compositions of semiconductor devices. In some embodiments die 100 can comprise numerous transistor structures (too small to be shown in FIG. 1) coupled in parallel. The structure of one example semiconductor device is illustrated in greater detail in U.S. patent application Ser. No. 14/857,497, for "IMPROVED GAN STRUCTURES" filed on Sep. 17, 2015 that is incorporated herein in its entirety for all purposes. Section A-A is taken through one such representative transistor structure and is illustrated and magnified in FIG. 2.

Figure 2:
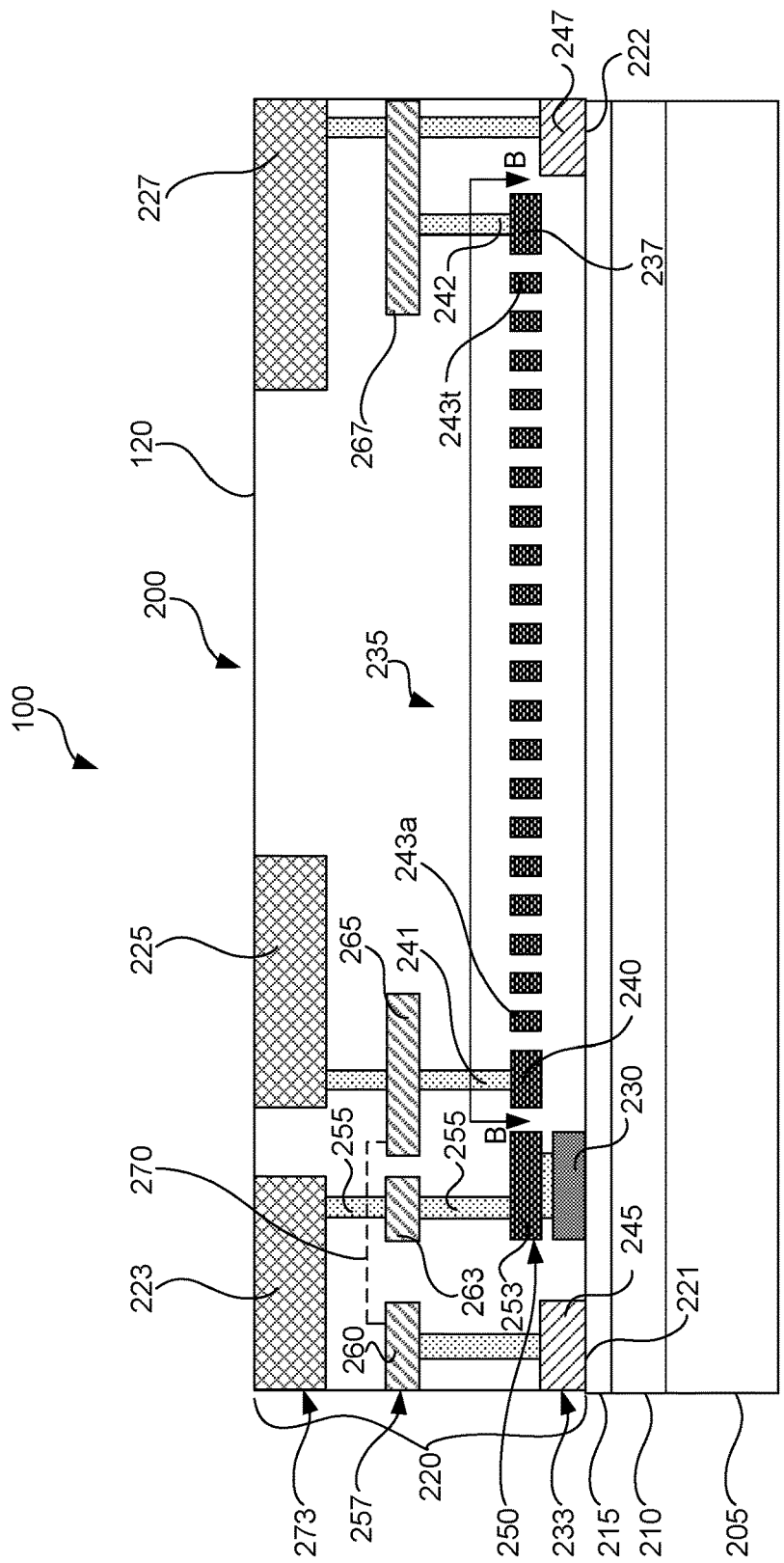
FIG. 2 is a cross-section of a transistor structure within the semiconductor die illustrated in FIG. 1.

FIG. 2 is a cross-section of a representative transistor structure 200 within semiconductor die 100 illustrated in FIG. 1. As shown in FIG. 2, transistor structure 200 can include a base layer 205, a substrate layer 210, a transition layer 215 and a top layer 220 that includes numerous metal, insulator and other layers, as described in more detail below.

Within top layer 220, there are three terminals disposed on top surface 120 of semiconductor die 100 that function as electrical connections to transistor structure 200. The three terminals include a source terminal 225, a gate terminal 223 and a drain terminal 227 which are typically metal and can be electrically coupled to external connections via wire-bonding, flip-chip or other methods.

Generally, transistor structure 200 operates as follows. A voltage applied to gate terminal 223 controls the presence or absence of a conductive two-dimensional electron gas (2DEG) that is formed in transition layer 215. When present, the conductive 2DEG forms an electrically conductive region within transition layer 215 that is contacted at both ends (left and right ends shown in FIG. 2) by an ohmic layer 233 that electrically couples portions of transition layer 215 to source terminal 225 and to drain terminal 227.

In a blocking state, the voltage applied at gate terminal 223 is equal to the voltage at source terminal 225, which eliminates the 2DEG under a gate stack 230, and the voltage between source terminal 225 and drain terminal 227 is supported or "blocked" so no current flows through transistor structure 200. In the blocking state, the voltage applied to drain terminal 227 depletes the 2DEG layer of charge, which eliminates the conductive 2DEG layer and allows the voltage to be supported.

Conversely, when a voltage potential is applied between gate terminal 223 and source terminal 225 the 2DEG is formed within transition layer 215 and electrically couples the source terminal to the drain terminal so current can flow through the transition layer. In this way the transistor operates as a switch that is controlled by the voltage applied to gate terminal 223.

When in the blocking state, the 2DEG is depleted in transition layer 215 with the assistance of a field termination structure 235 that includes a source plate 240 that is connected to source terminal 225, a plurality of floating plates 243a . . . 243t and a drain plate 237. Drain plate 237 is connected to drain terminal 227 and plurality of floating plates 243a . . . 243t are distributed between source plate 240 and drain plate 237. As shown in FIG. 2, field termination structure 235 distributes the electrical field from source terminal 225 across a large region of transition layer 215.

Plurality of floating plates 243a . . . 243t capacitively couples the voltage applied to source terminal 225 to each adjacent floating plate and to the adjacent transition layer 215. In the embodiment illustrated in FIG. 2, field termination structure 235 includes a series of 19 floating plates 243a . . . 243t distributed between source plate 240 and drain plate 237. Each floating plate 243a . . . 243t is capacitively coupled by either edge to two adjacent plates, however in other embodiments other capacitive coupling arrangements can be used, as described in more detail below.

In some embodiments, floating plates 243a . . . 243t can be capacitively coupled to one another with substantially equal capacitance values so the voltage potential that is applied between source terminal 225 and drain terminal 227 is uniformly distributed across field termination structure 235 and transition layer 215. Therefore, the use of floating plates 243a . . . 243t can maintain a substantially uniformly high electric field between the source and drain electrodes, limit the maximum electric field below the breakdown field of the semiconductor materials and minimize the space required to support the voltage applied between the source and the drain.

In some embodiments, disposing source plate 240 on one side (on the left side of FIG. 2) and drain plate 237 on the other side (on the right side of FIG. 2) of field termination structure 235 can shield the gate edge and drain edge from high fields. In further embodiments, source plate 240 can be increased in sized such that it extends further towards drain plate 237 to provide increases shielding of gate stack 230. In some embodiments source plate 240 can cover 10 percent of the distance between source via 241 and drain via 242. In further embodiments source plate 240 can cover 20 percent of the distance between source via 241 and drain via 242 while in other embodiments the source plate can cover over 30 percent of the distance. In some embodiments source field plate can have a width between 1 and 5 microns while in further embodiments it can have a width between 0.5 and 10 microns. In a similar fashion, drain plate 237 can be extended towards source plate 240 to shield the drain edge.

As described herein, floating plates 243a . . . 243t are referred to as "floating" because they are electrically isolated from all other electrically conductive structures within semiconductor die 100. Therefore, when a voltage is applied between source terminal 225 and drain terminal 227, each floating plate 243a . . . 243t "floats" to a particular voltage potential that is governed by the applied voltage potential between the source and drain terminals and the capacitance between each particular floating plate and the source terminal.

As an illustrative example, in the embodiment illustrated in FIG. 2, if a voltage of 600 Volts is applied between source terminal 225 and drain terminal 227, the 600 Volts would be broken into 20 substantially equal increments across floating plates 243a . . . 243t. Therefore, each portion of field termination structure 235 would only have a 30 Volt potential to each adjacent floating plate, including the last floating field plate 243t to drain plate 237 potential. The uniformity of the voltage potential across field termination structure 235 results in reduced regions of high charge and therefore in a reduced propensity for charge injection and trapping in transition layer 215 that can alter and/or degrade the characteristics of the semiconductor device.

As a comparison, in traditional field termination structures that can include continuous plates, the voltage potential between the end of the continuous field plate and the drain plate would be 600 Volts, resulting in high electric fields between the end of the continuous source plate and the drain plate resulting in a high propensity for charge injection and trapping.

In some embodiments the capacitance values across floating plates 243a . . . 243t can be varied (e.g., non-uniform capacitance values) such that an even lower electrical field is present between the last floating field plate 243t and drain plate 237 or other variations in capacitance values can be used to achieve other effects on the electric fields within transistor structure 200.

Myriad semiconductor devices and structures can benefit from the use of capacitively coupled floating field plates and field termination structure 235 illustrated in FIG. 2 is a non-limiting example of one embodiment. As discussed above, in some embodiments GaN can be used as the blocking semiconductor material because of the ease of forming a high mobility 2DEG layer, and the ability of the material due to its wide bandgap of supporting extremely high electric fields. In some embodiments the use of GaN enables the entire field termination structure to be designed in a relatively small distance.

For example, in one embodiment that employs a traditional continuous field plate structure, a 650 Volt rated device can have a gate-drain separation, including one or more field plates, in the range of 10-20 microns. This is still far from the theoretical limit of the material, which has a critical field in the range of 300 Volts/micron, to account for degradation due to the aforementioned effects of hot carrier injection. Comparatively, in the disclosed embodiments that employ capacitively coupled floating field plates, the gate-drain separation can be reduced below 18 microns, while in further embodiments the gate-drain separation can be reduced below 10 microns and in various embodiments the gate-drain separation can be reduced below 7 microns and in yet further embodiments it can be reduced below 5 microns.

As discussed above, in some embodiments die 100 can include a base layer 205 that can include silicon, a substrate layer 210 that can include GaN, a transition layer 215 that can include AlGaN and a top layer 220 that includes numerous metal, insulator and other layers, as described in more detail below. Other compounds, buffer, barrier and transition layers can also be included. These compounds are for example only and other embodiments can include other layers, compositions and structures, some of which are described in more detail below. This disclosure is in no way limited to the structures, layers or device compositions described herein.

In some embodiments, transition layer 215 can support the formation of a 2DEG that is induced by a combination of piezoelectric effect (stress), bandgap differential, and/or polarization charge. For example, there may be a reduction in the conduction band at the surface, where it drops below the fermi level to create a potential well that fills with electrons. In some embodiments, transition layer 215 comprises AlGaN in a range, for example, of aluminum (25%), gallium-nitride (75%) about 20 nanometers thick. In alternative embodiments, transition layer 215 may comprise ALN, AlGaInN, or another combination of materials. In some embodiments, transition layer 215 comprises a relatively thin boundary layer with high aluminum content and a thicker layer with less aluminum content. In further embodiments transition layer 215 may or may not have a cap layer.

In some embodiments top layer 220 can also include ohmic layer 233 that is disposed on transition layer 215 to form one or more ohmic contacts or "electrodes" to the transition layer. More specifically, ohmic layer 233 can include a source portion 245 that forms a source electrode 221 that is coupled to source terminal 225. Ohmic layer 233 can further include a drain portion 247 that forms a drain electrode 222 that is coupled to drain terminal 227. Ohmic layer 233 can be formed by a metal that is deposited and patterned to form the ohmic contacts. After the metal is patterned, it can be annealed to form low resistance electrical connections between ohmic layer 233 and transition layer 215.

As discussed above, in some embodiments gate stack 230 is also formed on transition layer 215 and is coupled to gate terminal 223. In one embodiment, gate stack 230 can include several layers of compound semiconductors which each can include nitrogen and one or more elements from column three of the periodic table, such as aluminum or gallium or indium or others (e.g., 3N layers). These layers can be doped or undoped. If they are doped they can be doped with either N-type or P-type dopants. Gate stacks corresponding with insulated gates, Schottky gates, PN gates, recessed gates, and other gates can be used.

In some embodiments gate metal layer 250 can be deposited above ohmic layer 233 and separated from the ohmic layer by one or more dielectric layers. In various embodiments gate metal layer 250 can have a gate portion 253 that is positioned above gate stack 230 and is connected to gate terminal 223 with one or more vias 255 to make a low resistance electrical connection. As discussed above, gate metal layer 250 can also include a source plate 240 coupled to source terminal 225, a plurality of floating plates 243a . . . 243t and drain plate 237.

In some embodiments an intermediate metal layer 257 can be formed above gate metal layer 250 and separated from the gate metal layer by one or more dielectric layers. Intermediate metal layer 257 can include a first segment 260 coupled to source terminal 225, a second segment 263 coupled to gate terminal 223, a third segment 265 coupled to source terminal 225 and a fourth segment 267 coupled to drain terminal 227. In some embodiments, intermediate metal layer 257 can have a fifth segment 270 that is not physically shown in FIG. 2 but is represented as a dashed line to indicate that an electrical connection is made within intermediate metal layer 257 between first segment 260 and third segment 265.

Similarly, any of the metal layers including gate metal layer 250, intermediate metal layer 257 and top metal layer 273 can include routing and interconnect structures that can be similar to fifth segment 270 that electrically couple two or more isolated regions. More specifically, any of the metal layers can be routed similar to metal layers on a printed circuit board to form electrical interconnects between regions on semiconductor die. As an example, fifth segment 270 that couples first segment 260 and third segment 265, can be made on any or all of layers including gate metal layer 250, intermediate metal layer 257 and top metal layer 273.

In some embodiments, top metal layer 273 can be formed above intermediate metal layer 257 and separated from the intermediate metal layer by one or more dielectric layers. In various embodiments, top metal layer 273 may primarily be used to carry high currents to various parts of semiconductor die 100 and to form source terminal 225, gate terminal 223 and drain terminal 227 that can be electrically coupled to external connections.

As discussed above, one or more vias 255 can be used to vertically couple one metal layer to another. In some embodiments vias 255 are formed from an electrically conductive material and extend between adjacent layers, however in other embodiments vias 255 can extend between two or more layers. In one embodiment vias 255 can extend from top metal layer 273 to ohmic layer 233. Vias 255 can be formed with any process, including but not limited to lithography, drilling or other means.

FIG. 3 illustrates cross-section B-B from FIG. 2. As shown in FIG. 3, a plan view of one embodiment of field termination structure 235 is shown. Field termination structure 235 can include a source plate 240 coupled to source terminal 225, a plurality of floating plates 243a . . . 243t and drain plate 237. In some embodiments a separation 305 between floating plates 243a . . . 243t is between 1.0 and 2.0 microns, while in various embodiments separation 305 is between 0.5 and 1.0 microns and in further embodiments separation 305 is between 0.25 and 0.5 microns. In some embodiments a width 310 of each of floating plates 243a . . . 243t is between 2.0 and 4.0 microns, while in various embodiments width 310 is between 1.0 and 2.0 microns and in further embodiments width 310 is between 0.5 and 1.0 microns. In some embodiments a capacitance between adjacent floating field plates 243a-243t is controlled by controlling the spacing between each plate and the dielectric properties of the material disposed between each plate. In some embodiments the dielectric material disposed between each plate is silicon-nitride while in other embodiments the dielectric material is silicon-dioxide, however further embodiments can use different dielectric materials.

FIG. 4 illustrates an alternative embodiment of field termination structure 235 and drain plate 237 having inter-digitated geometry to increase capacitive coupling between adjacent plates. As shown in FIG. 4 each plate has an interdigitated interface with each adjacent plate to increase capacitive coupling between adjacent plates. In the embodiment illustrated in FIG. 4 the plates have interdigitated structures but other embodiments can have other features such as but not limited to, serpentine, triangular or other shapes.

Although field termination structure 235 described above has been illustrated above as a "plate" type structure, the field termination structure is not limited to any particular shape and can be formed from any shape or configuration. In one embodiment, field termination structure 235 can be implemented as multiple layers of floating and capacitively coupled plates as described in more detail below.

Figure 5:
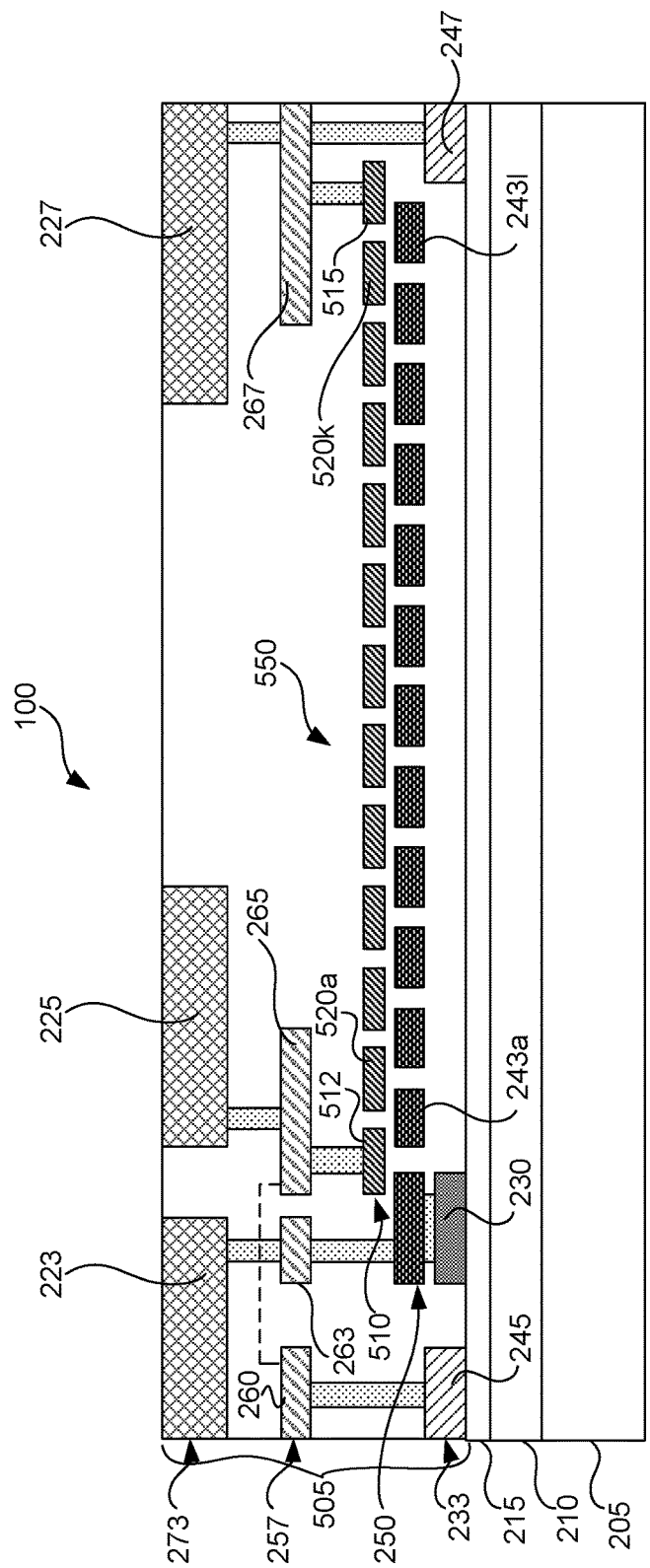
FIG. 5 is a cross-section of an alternative transistor structure within the semiconductor die illustrated in FIG. 1.

FIG. 5, illustrates a cross-section A-A of an alternative of transistor structure 200 that can be located within semiconductor die 100 illustrated in FIG. 1. As shown in FIG. 5, semiconductor die 100 includes a base layer 205, a substrate layer 210, a transition layer 215 and a top layer 505 that are similar to those illustrated in FIG. 2. However, in this embodiment, top layer 505 includes an upper gate metal layer 510 that is formed above gate metal layer 250 and below intermediate metal layer 257. In this embodiment, upper gate metal layer 510 includes an upper source plate 512 coupled to source terminal 225 and an upper drain plate 515 coupled to drain terminal 227, with a plurality of floating upper metal plates 520a . . . 520k positioned between the upper source plate and the upper drain plate.

Gate metal layer 250 includes a plurality of floating plates 243a . . . 243l that are laterally positioned to span across two floating upper metal plates 520a . . . 520k to improve capacitive coupling between adjacent floating upper metal plates 520a . . . 520k. Therefore, in this embodiment field termination structure 550 includes gate metal layer 250 and upper gate metal layer 510 that are used to form 23 floating plates that are coupled to each other laterally (within a particular metal layer) and vertically (between the gate metal and the upper gate metal layers). In other embodiments the metal layers used to form field termination structure 550 can be other metal layers and may not be gate metal layers. The additional layer of floating plates increases capacitive coupling between adjacent floating plates as compared to the structure illustrated in FIG. 2, while also improving the shielding of the surface from the effects of any electrical potentials in the metal layers and insulators above the field plates.

In some embodiments, floating plates 243a . . . 243l and floating upper metal plates 520a . . . 520k can be capacitively coupled to one another with substantially equal capacitance values so the voltage potential that is applied between source terminal 225 and drain terminal 227 is uniformly distributed across transition layer 215. However, in other embodiments the plates can be coupled together with unequal capacitance values. In some embodiments the plate width and plate separation can be similar as described above with regard to FIG. 2, however in other embodiments the plate width and separation can be varied. In one embodiment a space between floating plates 243a . . . 243l can be greater than 0.8 microns for a dielectric thickness in the range of 100 to 200 nanometers to allow at least a portion of upper metal plates 520a . . . 520k to extend down between each floating plate to improve effective plate to plate capacitance.

In the embodiment illustrated in FIG. 5 each floating plate 243a . . . 243l spans across two floating upper metal plates 520a . . . 520k, however in other embodiments each floating upper field plate can span across three or more upper metal plates. In various embodiments there can be one upper metal plate for each separation between floating plates 243a . . . 243l. In some embodiments first floating plate 243a can be connected to source terminal 225 and in further embodiments last floating plate 243l can be connected to drain terminal 227. As discussed above, in some embodiments one or more plates that are coupled to source terminal 225 can be extended towards drain terminal 227 and in various embodiments one or more plates that are coupled to drain terminal 227 can be extended toward source terminal 225. In some embodiments the one or more plates that are connected to the source and/or drain terminals 225, 227, respectively, can vary between 1 to 5 microns in width.

In further embodiments other capacitive structures can be used that include, but are not limited to interdigitated fingers and/or interdigitated layers insulated by a dielectric material or any other structure that exhibits a high capacitance. In yet further embodiments the number of capacitively coupled elements can vary between two and any number of elements. In one embodiment there is a third layer of metal having capacitively coupled elements between the source and the drain. In further embodiments, each capacitively coupled element can have a different size, shape and configuration, and as such each capacitively coupled element does not have to be necessarily uniform.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

What is claimed is:

1. A semiconductor device comprising:
a substrate including a transition layer that can form a two-dimensional electron gas;
a source electrode ohmically coupled to the transition layer;
a drain electrode ohmically coupled to the transition layer;
a gate stack formed on the transition layer; and
a field termination structure spaced apart from the transition layer and positioned between the gate stack and the drain electrode, wherein the field termination structure includes a source plate electrically connected to the source electrode and at least one capacitively coupled floating plate.

2. The semiconductor device of claim 1 wherein the field termination structure is disposed within a single layer and there are a plurality of floating plates capacitively coupled by adjacent edges to one another.

3. The semiconductor device of claim 1 wherein the field termination structure is formed on a metal layer that includes a drain plate coupled to the drain electrode, a source plate coupled to the source electrode and the at least one floating plate.

4. The semiconductor device of claim 3 wherein the at least one floating plate includes a plurality of isolated separate floating plates that are uniformly spaced apart from one another and are positioned between the drain plate and the source plate.

5. The semiconductor device of claim 4 wherein a voltage potential applied between the source electrode and the drain electrode is evenly distributed across the plurality of separate floating plates.

6. The semiconductor device of claim 1 wherein the field termination structure includes a first field plate formed on a first metal layer and a second field plate formed on a second metal layer that is spaced apart from the first metal layer.

7. The semiconductor device of claim 6 wherein the first field plate includes a plurality of separate floating plates that are uniformly spaced apart from one another and the second field plate includes a plurality of separate floating upper metal plates that are uniformly spaced apart from one another.

8. The semiconductor device of claim 7 wherein the plurality of separate floating plates are laterally positioned such that each of the plurality of separate floating upper metal plates overlaps at least two floating plates.

9. The semiconductor device of claim 6 wherein the substrate comprises gallium nitride.

10. A transistor comprising:
a substrate comprising a semiconductor material;
a source electrode coupled to the substrate;
a drain electrode coupled to the substrate;
a gate stack formed on the substrate; and
a field termination structure positioned between the gate stack and the drain electrode, wherein the field termination structure includes a source plate electrically connected to the source electrode and at least one capacitively coupled isolated plate.

11. The transistor of claim 10 wherein the substrate comprises a transition layer capable of forming a two-dimensional electron gas.

12. The transistor of claim 10 wherein the field termination structure is formed within a single layer and there are a plurality of isolated plates capacitively coupled by adjacent edges to one another.

13. The transistor of claim 10 wherein the field termination structure is formed on a gate metal layer that includes a drain plate coupled to the drain electrode, a source plate coupled to the source electrode and the at least one isolated plate positioned between the drain plate and the source plate.

14. The transistor of claim 13 wherein the at least one isolated plate includes a plurality of separate isolated plates that are uniformly spaced apart from one another and are positioned between the drain plate and the source plate.

15. The transistor of claim 10 wherein the field termination structure includes a first field plate formed on a gate metal layer and a second field plate formed on an upper metal layer that is spaced apart from the gate metal layer.

16. The transistor of claim 15 wherein the first field plate includes a plurality of separate floating plates that are uniformly spaced apart from one another and the second field plate includes a plurality of isolated upper metal plates that are uniformly spaced apart from one another.

17. The transistor of claim 16 wherein the plurality of isolated floating plates are laterally positioned such that each of the plurality of separate floating upper metal plates overlaps at least two floating plates.

18. A semiconductor device comprising:
a substrate including a semiconducting layer;
an ohmic metal layer formed on the substrate and including a source portion and a drain portion;
a gate stack formed on the substrate;
a metal layer formed above and separated from the ohmic metal layer and including a source plate, a drain plate and a plurality of electrically isolated plates; and
a top metal layer formed above and separated from the metal layer and including a gate terminal, a source terminal and a drain terminal, wherein the gate terminal is electrically connected to the gate stack, the source terminal is electrically connected to the source plate, and the drain terminal is electrically connected to the drain plate.

19. The semiconductor device of claim 18 wherein the plurality of electrically isolated plates are capacitively coupled by adjacent edges to one another.

20. The semiconductor device of claim 18 wherein the plurality of electrically isolated plates are positioned between the source plate and the drain plate.

* * * * *